United States Patent [19]
Kubena

[11] Patent Number: 5,548,129
[45] Date of Patent: Aug. 20, 1996

[54] QUANTUM WELL STRUCTURE WITH SELF-ALIGNED GATE AND METHOD OF MAKING THE SAME

[75] Inventor: Randall L. Kubena, Agoura, Calif.

[73] Assignee: Hughes Aircraft Company, Los Angeles, Calif.

[21] Appl. No.: 509,921

[22] Filed: Aug. 1, 1995

Related U.S. Application Data

[62] Division of Ser. No. 179,177, Jan. 10, 1994, Pat. No. 5,489,539.

[51] Int. Cl.$^6$ ........................ H01L 29/06; H01L 31/0328
[52] U.S. Cl. ................. 257/24; 257/25; 257/192; 257/194; 257/401; 257/27
[58] Field of Search ................. 257/24, 25, 192, 257/194, 401, 27

[56] References Cited

U.S. PATENT DOCUMENTS

| | | | |
|---|---|---|---|
| 4,662,058 | 5/1987 | Cirillo, Jr. et al. | 29/571 |
| 4,700,462 | 10/1987 | Beaubien et al. | 437/187 |
| 4,769,683 | 9/1988 | Goronkin et al. | 357/4 |
| 4,771,017 | 9/1988 | Tobin et al. | 437/203 |
| 4,959,326 | 9/1990 | Roman et al. | 437/40 |
| 4,975,382 | 12/1990 | Takasugi | 437/40 |
| 4,983,540 | 1/1991 | Yamaguchi et al. | 437/110 |
| 5,113,072 | 5/1992 | Yamaguchi et al. | 250/309 |
| 5,155,053 | 10/1992 | Atkinson | 437/40 |
| 5,283,445 | 2/1994 | Saito | 257/20 |
| 5,285,081 | 2/1994 | Ando | 257/24 |
| 5,336,904 | 8/1994 | Kusunoki | 257/24 |

OTHER PUBLICATIONS

Randall et. al, "Fabrication of Lateral Resonant Tunneling Devices", Journal of Vacuum Science Technology, B 10 (6), Nov/Dec. 1992, pp. 2941–2944.

Chou et. al, "Lateral Resonant Tunneling Field–Effect Transistor", Applied Physics Letters, 52(23), Jun. 6, 1988, pp. 1982–1984.

Nakata et. al, "Fabrication of Quantum Wires By Ga Focused–Ion–Beam Implantion and Their Transport Properties", Japanese Journal of Applied Physics, vol. 29 No. 1, Jan. 1990, pp. 48–52.

Chao et al., "Electron Beam Fabrication of GaAs, Low–Noise MESFETS Using a new Trilayer Resist Technique", IEEE Transactions on Electron Devices, vol. ED–32, No. 6, Jun. 1985, pp. 1042–1046.

Nakata et. al, "Transport Characteristics of AlGaAs/GaAs wires fabricated by focused Ga–ion beam implantation", J. Appl. Phys., 69(6), 15 Mar. 1991, pp. 3633–3640.

*Primary Examiner*—Mark V. Prenty
*Attorney, Agent, or Firm*—V. D. Duraiswamy; W. K. Denson-Low

[57] ABSTRACT

Quantum well structures are fabricated by use of a process employing a Focused Ion Beam (FIB) scanning in the surface of a semiconductor substrate. The quantum well structures thus fabricated include Resonant Tunneling Transistors (RRTs) and one dimensional quantum wire devices, fabricated in conventional Metal Semiconductor Field Effect Transistors (MESFETs) or in High Electron Mobility Transistors (HEMTs). The RRT comprises a pair of implant barriers in the semiconductor substrate, whereby charge carriers are capable of tunneling through the implant barriers into the quantum well during the state of resonance. The one dimensional quantum wire device comprises a multiplicity of implant barriers disposed in the semiconductor substrate substantially parallel to the travelling direction of the charge carriers. The intersection of the implant barriers and the two dimensional gas (2DEG) inside the HEMT enclose truly one dimensional quantum wells which enable electrons to travel therethrough with high mobility. In addition, the potentials of the quantum wells or quantum wires are controlled by a self-aligned gate, such as a T-gate.

10 Claims, 10 Drawing Sheets

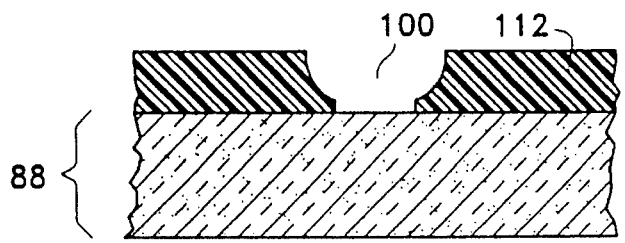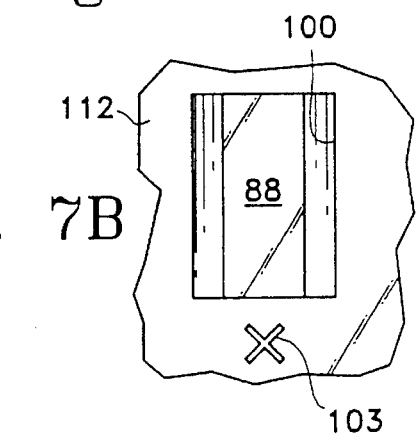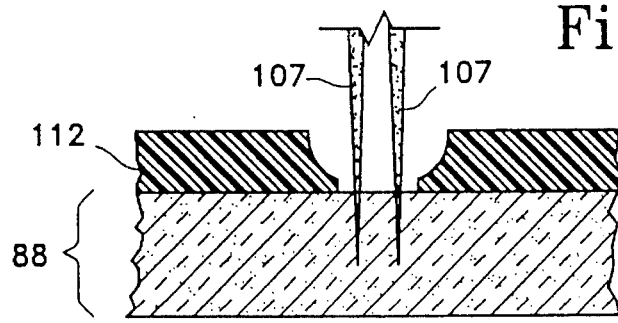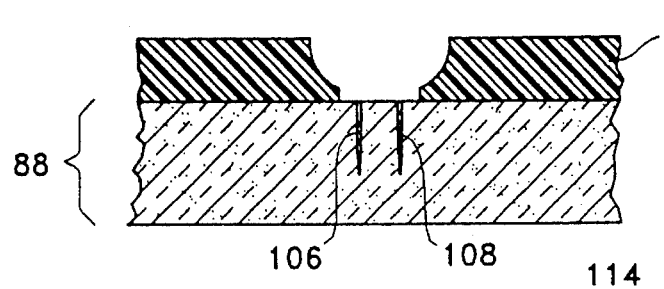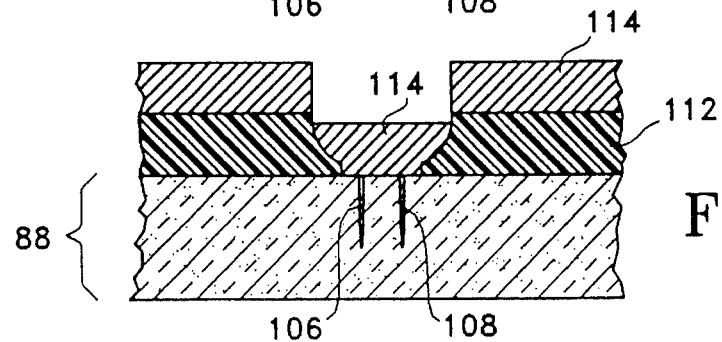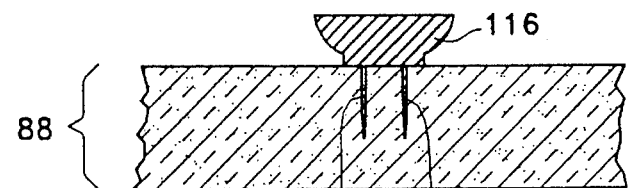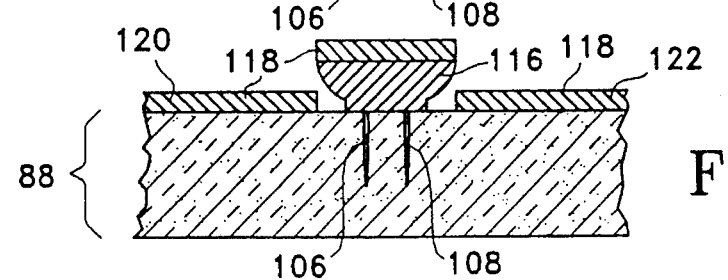

QUANTUM WELL STRUCTURE WITH SELF-ALIGNED GATE AND METHOD OF MAKING THE SAME

This is a division of application Ser. No. 08/179,177 filed Jan. 10, 1994 now U.S. Pat. No. 5,489,539.

BACKGROUND OF THE INVENTION

1. Field of the Invention

The present invention relates to a semiconductor structure and method of making the same. More specifically, this invention is related to quantum well structures, including resonant tunneling devices fabricated on a semiconductor substrate.

2. Description of the Related Art

Modern day electronic systems are capable of operating at very high speed based on fast-switching integrated circuits. However, there are always some circuits associated with these electronic systems that must operate at an even higher pace. A telecommunication system is such an example. In such a system, electrical signals are transmitted or received serially through a transmission medium via an antenna, or an optical or electrical cable. However, the serially received signals are processed parallelly in the main system. Thus these front-end circuits directly linked to the transmission medium must operate at a speed higher than the main system in order to avoid transmission bottleneck. In one example of a digital system, the main system processes thirty-two bits of digital data plus a few bits as parity checks in one clock cycle. These front-end circuits must operate at least thirty-two times faster than the main circuits for an optimal overall system performance. As these main processing systems are more and more designed towards the parallel architecture, there will be an increasing demand for faster electronic components for the implementation of such circuits.

A transistor's speed performance can be gauged by a parameter called Cut-Off Frequency ($f_T$). Cut-off frequency is defined as the frequency for which the output to input gain ratio of the device is maintained above 3 db. Silicon-based circuits can be used for the front-end circuits mentioned above. However, mobilities of charge carrier in silicon are inherently slower than other semiconductor materials. One specific area that shows prominence is the development of Metal Semiconductor Field Effect Transistors (MESFET) utilizing the group III–V compounds. A conventional depletion mode GaAs (Gallium Asenide) MESFET can easily surpass a cut-off frequency of 10 GHz.

To further enhance performance, several variations of a MESFET were evolved in the past, such as the High Electron Mobility Transistor (HEMT). A HEMT is basically the same as a conventional MESFET, except a heavily doped layer is superimposed on top of an undoped layer in the semiconductor substrate. The bandgap of the doped layer is larger than that of the undoped layer. When the two materials are structurally brought together, their Fermi levels are aligned with each other. As a result, the conduction band is at a higher energy level in the doped material in comparison with its counterpart in the undoped material. During normal operation in the conduction mode, electrons from the source of the HEMT migrate into the heavily doped layer but are attracted into the undoped layer due to the inherent tendency of electrons to travel to a region with a lower energy state. The electrons travel in the form of a thinly charged sheet called the Two Dimensional Electron Gas (2DEG). The 2DEG is substantially parallel to and in close proximity with the boundary surface of the doped and undoped layer, but is located in the undoped layer. The undoped layer, being relatively free of charge scattering interferences as compared to the doped layer, enables the electron to travel with a higher mobility. Thus HEMTs are capable of operating at a higher speed than conventional MESFETs.

Another approach to improve the operational speed of MESFETs or HEMTs is to build them with smaller geometries, to reduce the parasitic capacitances. The source and drain are disposed closer together on the semiconductor substrate, with the channel assuming a much shorter length. Consequently, the gate contact traversing across the channel length is also scaled down in cross-sectional area. As a result, the gate resistance is increased, which in turn degrades the device's performance. To reduce the gate resistance, a goblet-shaped gate contact with a larger cross-sectional area called a T-gate is disposed atop the channel. In conjunction with the smaller dimensions, this produces a faster device with lower noise. Self-alignment of the source and the drain with respective to the T-gate further helps to increase the device's speed limit.

In an attempt to further increase speed and possibly to break through the tera Hertz barrier, Resonant Tunneling Transistors (RTTs) designed as a HEMT have been proposed. A RTT requires only minimal voltage swings as the signal control on the gate terminal. There is no need to sweep the gate with high voltage amplitudes to direct a RTT in and out of resonance. This feature enables the resonant tunneling structure to function as a high speed switching device.

To understand the operation of a resonant tunneling structure, the behavior of electrons must be briefly explained. Each electron in the conduction band assumes its own discrete energy state in an individual atom. However, when the atoms are brought together, wave functions of the electrons begin to interact with each other. From the Principle of Exclusion, no two electrons can occupy the same energy state in a closed energy system. As a consequence, multiple energy states exist in the form of a quasi-continuous spectrum in the conduction band. However, when fewer atoms are confined in a restricted space, the number of energy states is reduced and the energy states become more distinctly separated from each other. The restricted space is called a quantum well, wire, or dot depending on the number of the confinement of the electron mobility. The separated energy states are called sub-bands within the quantum well. The smaller the physical size of the quantum well, the more distinct are the separations of the sub-bands. This phenomenon is called the confined quantum effect.

In practice, a quantum well is enclosed within potential barriers in a semiconductor material. In this specification and in the appended claims, the term "potential barrier" is defined as an isolation between two closed energy systems, with each closed energy system asserting its own potential distribution for its charge carriers. The term potential barrier includes resistive barriers, field-induced barriers, or simply physical gaps devoid of materials. In a quantum diode, for example, a thin layer of semiconductor material is sandwiched between two resistive layers which act as potential barriers. FIG. 1 illustrates such a resonant tunneling diode which is signified by reference numeral 2. Quantum well 4 is sandwiched between first and second potential barrier layers 6 and 8. During resonance, electrons from cathode 10 traverse first barrier 6 into quantum well 4, and pass through second barrier 8 and reach anode 12. First and second metal contacts 14 and 16 allow resonant tunnelling diode 2 to electrically communicate with other devices. Due to the difficulty with forming an electrical contact with quantum well 4, the quantum well potential can not be controlled. As a consequence, a two-terminal device can only be built which can not be used as a digital switch or as an amplifier.

To alleviate this drawback, three terminal resonant devices were designed in the past. An example of such a device is shown in FIG. 2. Resonant tunneling transistor signified by reference numeral 18 is formed on a heterojunction structure 19. Quantum well 34 is defined within first and second voltage-induced potential barriers 28 and 30 controlled by first and second barrier control terminals 24 and 26, respectively. Potential barriers 28 and 30 are basically inverted semiconductor regions induced by the bias voltage on control terminals 24 and 26. It should be noted that potential barriers 28 and 30 disappear once the bias voltage is removed. Control terminals 24 and 26 are formed on the semiconductor substrate 19 via the conventional method of e-beam lithography and lift-off. The detailed structure and method of fabrication of this type of resonant tunneling device can be found in J. N. Randall et al., "Fabrication of Lateral Resonant Tunneling Devices", *Journal of Vacuum Science Technology*, B 10(6), Nov/Dec 1992, pages 2941–2944. A device of similar construction is also disclosed in S. Y. Chou et al., "Lateral Resonant Tunneling Filed-Effect Transistor", *Applied Physics Letters*, 52(23), Jun. 6, 1988, pages 1982–1984. In FIG. 2, the potentials of the sub-bands in quantum well 34 is controlled by control gate 22. When the sub-bands are in alignment with the Fermi level of the source, electrons tunnel through the potential barrier 28, quantum well 34, potential barrier 30, respectively, and the device is said to be in resonance. Thus RRT can be used as a switching device. However, the RRT thus fabricated, is relatively large in size. The reasons are twofold. First, control terminals 24 and 26, normally defined by the conventional lithographic process, are limited in resolution. A typical dimension for the terminals 24 and 26 fabricated with e-beam lithography is of the order of 30–60 nanometers. Most detrimental of all is side-fringing effect of the electric field underneath control terminals 24 and 26, which tends to spread out the field-induced potential barriers 28 and 30 laterally. Excessive spreading of the induced electric field may cause barriers 28 and 30 to bridge with each other, resulting in the elimination of the quantum well 34. To avoid the merging of the barriers, the control terminals 24 and 26 must be widely separated. As was previously mentioned, large quantum wells do not have sharp and well defined sub-bands. Consequently, the sub-bands within the relatively large quantum well 34 are not very distinctly defined. Degradation of the device performance follows with the most pronounced effect being the reduction in peak-to-valley current ratio and considerable thermo-excited leakage current during the out-of-resonant state. These drawbacks seriously degrade the device performance which renders the device to be practical only in the low temperature range. Typically, functional performance with current densities below 110 $A/cm^2$ can only be obtained under 20 degrees Kelvin with this type of structure. As a comparison, an RTT may need to deliver a current density in excess of $10^4$ $A/cm^2$ to be considered as a practical device. Moreover, there is considerable gate resistance embedded within gate contact 22 as its thickness is typically less than 100 nanometers. In addition, source 21 and drain 20 are not fabricated with a self-aligned process with respect to the gate 22. Consequently, source 21 and drain 20 are spaced away from each other resulting in higher source resistance. The parasitic capacitances resulting from the inherently large-sized device also limit its frequency response. Devices of this type, although exhibiting some confined quantum effects at low temperature, are difficult to be used in practical applications due to its slow speed, high noise output, and the low temperature operation requirement.

Experiments have been performed in the past to study the confined quantum effect of electrons in a quantum well defined by ion-implanted barriers. One such research work is reported in Nakata et al., "Fabrication of Quantum wires by Ga Focused-Ion-Beam Implantation and Their Transport Properties", *Japanese Journal of Applied Physics*, Volume 29, No. 1, January 1990 pages 48–52. In Nakata et al., the magnetoconductance of electrons in a one-dimensional quantum wire is studied. Micro-probes are used to launch, receive, and detect the charge carriers. Having only one quantum well yields very limited current density. Furthermore, the associated probes substantially introduce parasitic inductances and capacitances to the device, which render it difficult to be operated under high speed operation. The structure in Nakata et al. can not be used as a practical device.

SUMMARY OF THE INVENTION

The main objective of the present invention is to utilize a novel fabrication technique to provide novel resonant tunnelling structures that have a cut-off frequency approaching the tera Hertz level, can be used at room temperature, and are capable of supplying a high output current so they can be used with other circuits having capacitive loads. A smaller device size, allowing for a greater yield per unit space on a semiconductor substrate and thus reduction in manufacturing cost is also sought.

Another objective is to utilize the above mentioned novel manufacturing technique to provide a novel quantum well structure that is capable of confining electrons to a one dimensional movement. Electron mobility is substantially improved, which enables the structure to function as a high speed device.

With the use of a Focused Ion Beam (FIB), highly contrasted implant barriers are etched in the semiconductor substrate, whereby permanent quantum wells are defined between the implant barriers. Quantum wells thus fabricated, are substantially smaller in physical size, in contrast with the quantum wells fabricated with prior art techniques. Small quantum wells enable quantum well structures to be operable under room temperature, and assume other benefits as were previously described. The semiconductor is preferably made of materials comprising compounds from Group III–V of the Periodic Table.

In one embodiment of the invention, a pair of Ga+ ion-implant barriers are scanned into the channel of a conventional MESFET. The space confined within the implant barriers constitutes a quantum well. Through the control of the gate terminal directly atop the quantum well, the energy sub-bands within the quantum well can be adjusted to align with the Fermi level of the source and drain. When the energy bands are mis-aligned, only leakage current can flow from source to drain. When the energy bands are in alignment, the structure is said to be in resonance, and under an applied voltage from source to drain, charge carriers from the source tunnel through the first implant barrier into the quantum well, and then tunnel out of the quantum well through the second implant barrier to reach the drain. The resonant tunneling structure can be utilized as a switching device, with the on and off signal states corresponding to the resonant and out-of-resonant states of the structure, respectively. An optional T-gate can also be fabricated as the gate contact to reduce the gate resistance. Device performance can be enhanced further by fabricating the source and the drain to be self-aligned with respect to the gate.

In a second embodiment, the resonant tunneling structure is fabricated as a HEMT. The FIB is scanned deep into the surface of the semiconductor substrate such that the ion implant barriers cross the 2DEG. The condition for resonance is the same as in the first embodiment, except that electrons assume a higher mobility in the 2DEG region. A T-gate can also be disposed atop the quantum well region for further speed improvement.

In another embodiment, the implant barriers are scanned in the surface of the semiconductor substrate as a cluster of lines parallel to the direction of electron flow. This embodiment can be fabricated in a conventional MESFET or in a HEMT. In the HEMT embodiment, the implant barriers intersects the 2DEG. The multiple implant barriers partition the 2DEG into a multiplicity of wire-shaped quantum wells. Electrons assume a true single degree of movement along these wire-shaped quantum wells, providing a substantial improvement in electron mobility. As in the other embodiments, a T-gate can also be formed on top of the clusters for optimal device performance.

These and other features and advantages of the invention will be apparent to those skilled in the art from the following detailed description, taken together with the accompanying drawings in which like reference numerals refer to like parts.

DESCRIPTION OF THE DRAWINGS

FIG. 7A–7G are sectional views of a preferred fabrication process for a resonant tunneling structure with a T-gate;

DETAILED DESCRIPTION OF THE INVENTION

Figure 1:
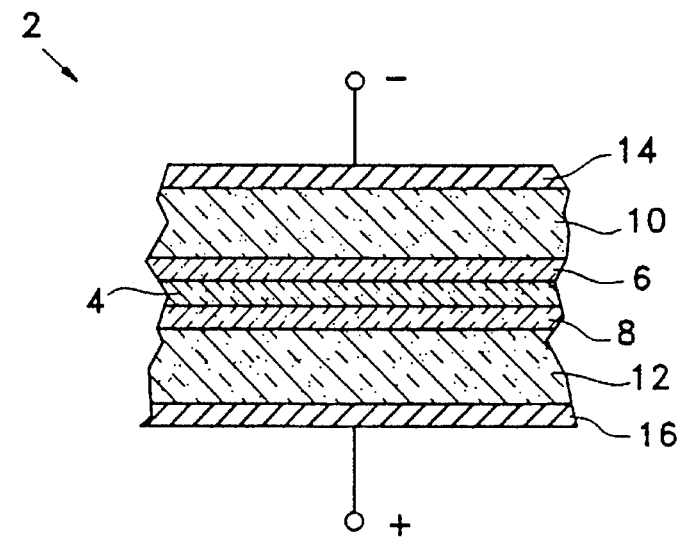
FIG. 1, as described above, is a sectional view of a prior art resonance tunneling diode fabricated as a multi-layered structure.
Figure 2:
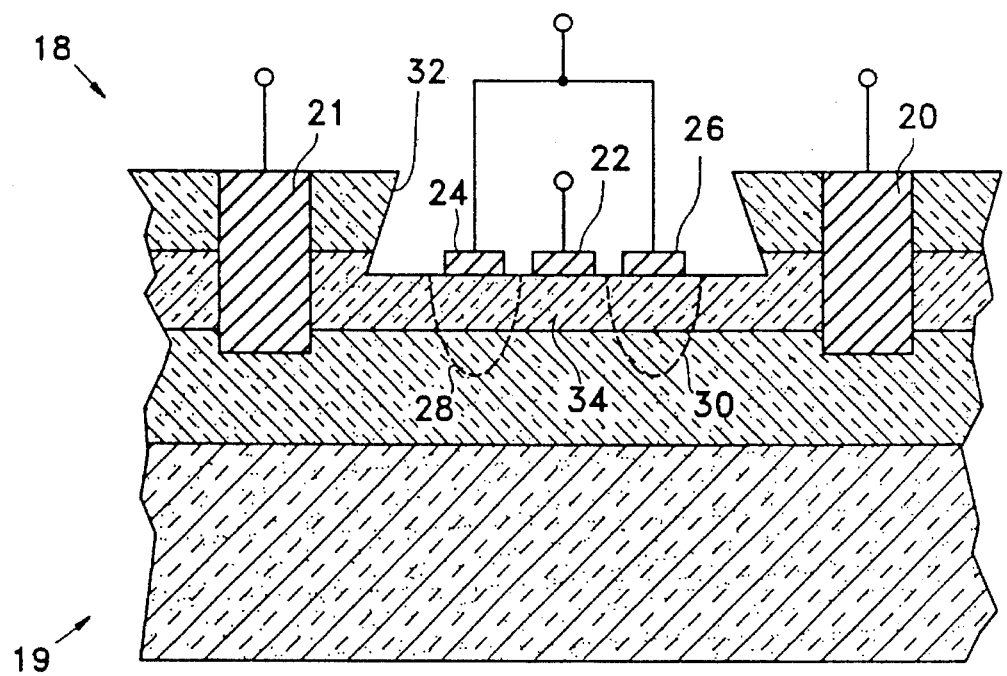
FIG. 2, as described above, is a sectional view of a prior art resonant tunneling transistor utilizing field-induced potential barriers for the definition of a quantum well.
Figure 3A:
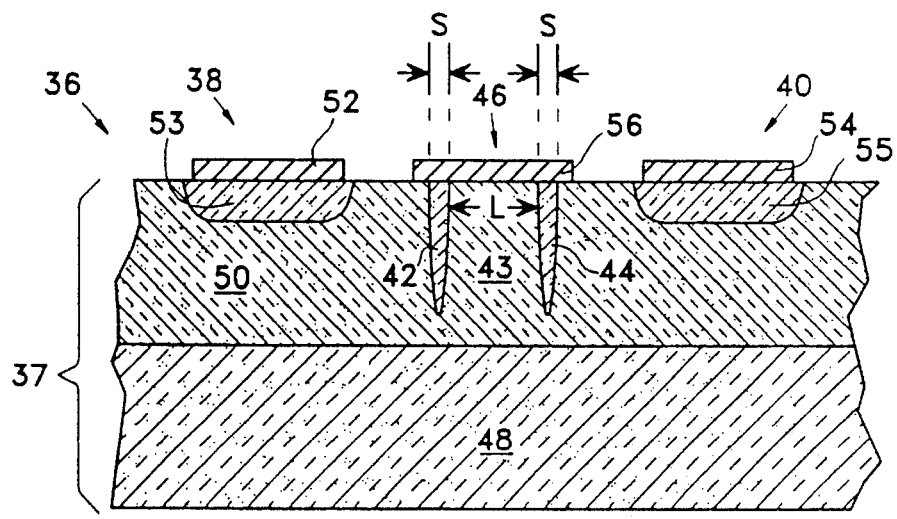
FIG. 3A is a sectional view of a resonant tunneling structure of one embodiment of the present invention.
Figure 3B:
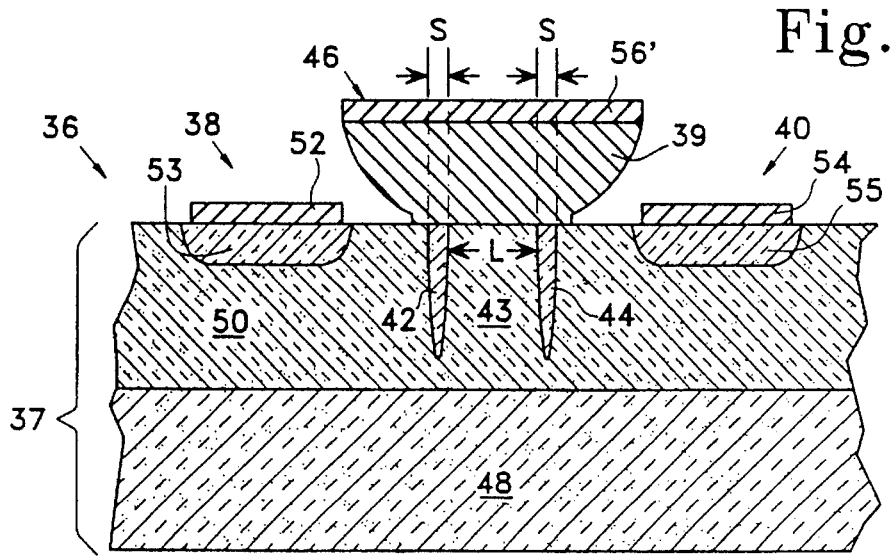
FIG. 3B is a sectional view of the resonant tunneling structure of FIG. 3A, but with a T-gate.
Figure 3C:
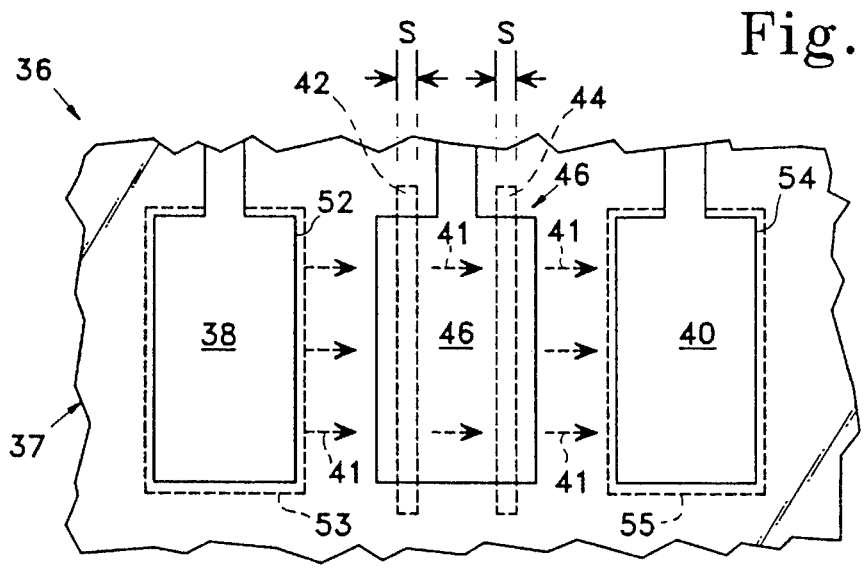
FIG. 3C is a top plan view of the resonant tunneling structure of FIG. 3A.

Reference is now made to FIGS. 3A to 3C, which show one embodiment of a resonant tunneling structure 36 of the present invention fabricated in a conventional MESFET. The dimensions of the various layers and contacts in the drawings are not drawn to scale for the purpose of a clear illustration. Support layer 48 is the substrate upon which an epitaxial layer 50 is grown. Implant barriers 42 and 44 in this embodiment are formed by the ion-implantation of Gallium ions via a Focused Ion Beam (FIB) with a resolution of below 10 nanometers. Implant barriers 42 and 44 are highly resistive resulting from the damaged crystal lattices within active layer 50, or from carrier compensation after annealing. Quantum well 43 is defined within first and second implant barriers 42 and 44. Source 38 and drain 40 are formed adjacent to first and second implant barriers 42 and 44, respectively. Source 38 and drain 40 comprise source contacts 52 and 54 disposed atop implant regions 53 and 55, respectively. Implant regions 53 and 55 in this embodiment are Silicon (Si) implants formed in active layer 50.

Because of the close proximity of first and second implant barriers 42 and 44 and with their highly contrasted definition, quantum well 43 can be fabricated with a very small geometry. In this embodiment, the lateral dimension of the effective length of quantum well signified by the letter L is approximately 30 nanometers, and the width of each of implant barriers 42 and 43 identified by the letter S is approximately 9 nanometers. Because of the small dimension of effective length L, quantum well 43 is sometimes called a quantum wire. In some technical literature, it is called a quasi-quantum wire, to differentiate it from a true quantum wire in which electrons are confined to a one dimensional movement. For consistent terminology, in this specification and in the appended claims, the word "quantum well" is a generic term and is construed as a confined space whereby charge carriers confined within the confined space exhibit the confined quantum effect. Thus the usage of the word quantum well would include quantum wire or quasi-quantum wire, unless specifically specified.

The advantage of fabricating quantum well devices with small quantum wells and with well defined barriers is multi-fold. To begin with, a small quantum well provides more distinct separations of sub-bands, as was previously explained. Moreover, a small quantum well allows the fabrication of devices with smaller overall sizes and thus less parasitic elements. Devices can operate at a higher speed as a consequence. Another important benefit associated with smaller quantum well barriers is the fact that a device with smaller barriers is capable of delivering higher current density. The reason is because smaller barriers increase the energy width of the resonance, thereby allowing more electrons to tunnel through the quantum well from the source to the drain.

The operation of resonant tunneling structure 36 is explained by referring to FIGS. 3A–3C. In this embodiment, substrate 37 and source contact 52 are electrically connected to ground potential. Drain contact 54 is tied to a positive voltage while gate contact 56 (39 in FIG. 3B) is negatively or positively biased with respect to active layer 50 of substrate 37. Source and drain contacts 52 and 54 establish normal ohmic contacts with active layer 50 through implant regions 53 and 55, while gate contact 56 (39 in FIG. 3B) forms a Schottky barrier with active layer 50. The Schottky barrier exists as a depletion region underneath gate contact 56 in active layer 50 in FIG. 3A, or under T-gate 39 in FIG. 3B. The voltage variation applied to gate 46 controls the potentials of sub-bands inside quantum well 43. Suppose a voltage potential is applied across drain 40 and source 38 via contacts 54 and 52, respectively. The potential of source 38 is the same as the potential of substrate 37 which is at ground level. When the Fermi level of source 38 is not in alignment with any of the sub-bands inside quantum well 43, only leakage current can tunnel through barriers 42 and 44. This leakage current is mostly caused by thermo-excitation and in this embodiment, the value is in the order of 0.1 nA. Suppose also that another voltage is applied between gate 46 and substrate 37. The potentials of sub-bands inside quantum well 43 shift with the applied voltage. When any of the sub-bands coincides with the Fermi level of source 38, structure 36 is said to be in a state of resonance. During resonance, electrons from source 38 tunnel through first barrier 42, quantum well 43, second barrier 44, and into drain 54, under the applied voltage across drain 40 and source 38. It here will be noted that the potential difference between adjacent sub-bands is in the order of a small fraction of a Volt. With structure 36 used as a switching device, there is no need for gate 46 to scan a wide range of voltage to turn the device on or off. Necessary transient time is required to sweep a voltage from high to low or vice versa. Since no wide voltage swing at gate 56 is involved and the switching transient time is reduced to a minuscule value, structure 36 can be used as a high-frequency switching device.

FIG. 3B shows structure 36 being embodied with T-gate 39 as a gate contact to active layer 50. T-gate 39 further curtails the gate resistance of structure and thus improves the performance of the structure. In addition, the source contact 52 and the drain contact 54 shown in FIG. 3B are fabricated to be self-aligned with the T-gate 39. The result is a device with a smaller overall geometry and with well defined contact terminals 52, 54 and 39. The consequential benefit is a further enhancement in terms of speed performance. The formation of T-gate 39 is discussed in detail in U.S. Pat. No. 5,155,053 to Atkinson, Oct. 13, 1992, assigned to the same assignee as the present invention. The disclosure of U.S. Pat. No. 5,155,053 is incorporated herein by reference.

FIG. 3C shows the top plan view of structure 38 of FIG. 3A. Implant barriers 42 and 44 are substantially elongated in shape having a widths of less than 10 nanometers in this embodiment and are disposed perpendicular to the direction of electron flow 41 during the state of resonance.

Figure 4A:
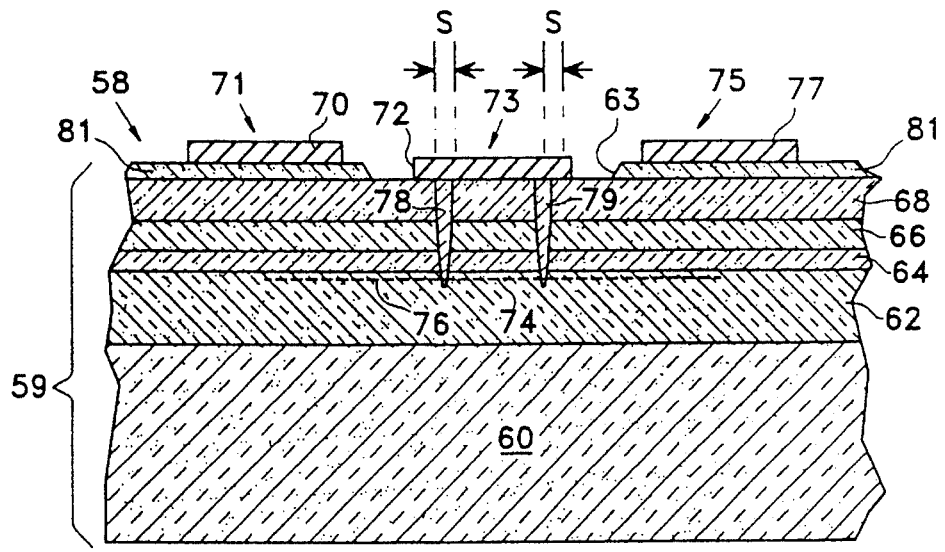
FIG. 4A is a sectional view of a second embodiment of the invention in which a resonant tunneling structure is fabricated as a HEMT.
Figure 4B:
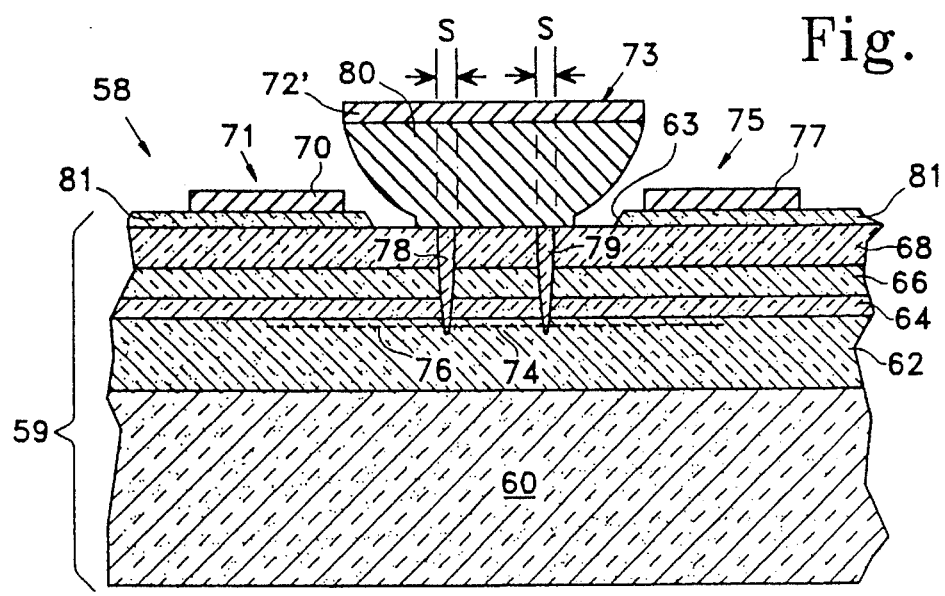
FIG. 4B is a sectional view of the resonant tunneling structure of FIG. 4A, but with a T-gate.
Figure 4C:
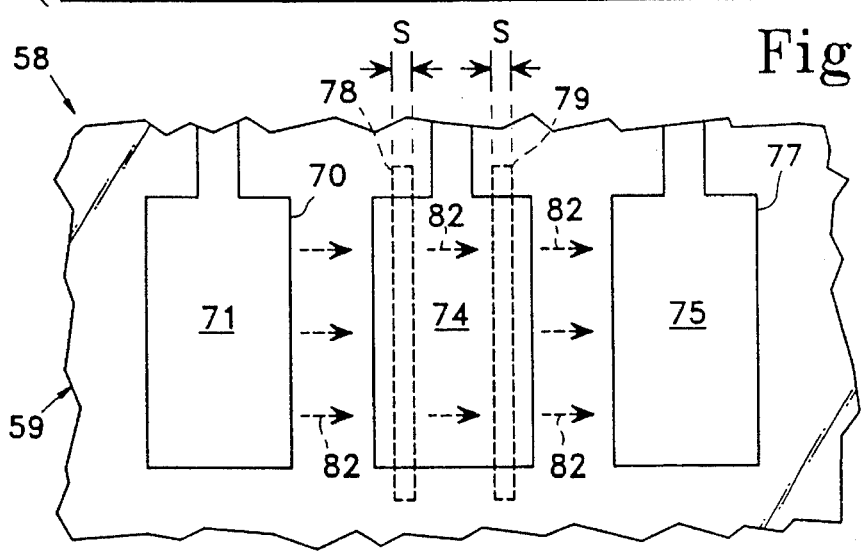
FIG. 4C is a top plan view of the resonant tunneling structure of FIG. 4A.

FIGS. 4A–4C show another embodiment of the invention fabricated as a HEMT identified by reference numeral 58. Resonant Tunneling structure 58 includes support layer 60 with channel layer 62 adjacently disposed thereon. Support layer 60 acts as a mechanical support for structure 58 and is lattice-matched with channel layer 62. Channel layer 62 can be formed on support layer 60 by Molecular Beam Epitaxy (MBE). In the preferred embodiment, support layer 60 is Indium Phosphorous (InP) and channel layer 62 is a compound of Indium Gallium Asenide (InGaAs). Atop channel layer 62 are spacer layer 64 and donor layer 66. There is also a Schottky layer 68 overlying donor layer 66, and a cap layer formed on the top of Schottky layer 68. Spacer layer 64 and donor layer 66 can be deposited on the top surface of channel layer 62 by MBE at a temperature of 600 degrees Celsius, for example. In this embodiment, spacer layer 64 and donor layer 66 are both built of Aluminum Indium Asenide (AlInAs). However, channel layer 62 and spacer layer 64 are intrinsic layers free of dopants, while donor layer 66 and cap layer 81 are laced with Silicon (Si) to form n-type semiconductor materials. Donor layer 66 can be a very thinly deposited layer, sometimes called a delta doped layer, formed atop spacer layer 64. Spacer layer 64 serves as a buffer zone for a smooth crystal lattice transition between donor layer 66 and channel layer 62. The band-gaps in both the doped donor layer 66 and the undoped spacer layer 64 are higher than that of the undoped channel layer 62 due to the presence of Aluminum (Al) atoms in donor layer 66 and spacer layer 64, and Gallium (Ga) atoms in channel layer 62. The formation of a n-type doped donor layer 66 adjacent to undoped spacer layer 64 serves a special purpose in a HEMT which will be described in detail later. Schottky layer 68 can also be grown on donor layer 66 by the MBE process. In this embodiment, the physical thicknesses of channel layer 62, spacer layer 64, donor layer 66, Schottky layer 68, and cap layer 81 are 400, 20, 30, 200, and 70 angstroms, respectively.

Electrical contacts are made possible by the deposition of source and drain contacts 70 and 77 on the top surface of cap layer 81, and by the deposition of gate contact 72 (80 in FIG. 4B) on the top of Schottky layer 68. Notice that there is a recess 63 etched out of the surface of cap layer 81 underneath gate contact 72 in FIG. 4A, or T-gate 80 in FIG. 4B, during the fabrication process for the purpose of securing a more contaminant-free and thus a better Schottky contact with controllable threshold voltages. As with the previous embodiment, due to the selective biasing, gate contact 72 in FIG. 4A, or T-gate 80 in FIG. 4B, forms a Schottky contact with Schottky layer 68, while source and drain contacts 70 and 77 form normal ohmic connections with cap layer 81.

It here will be noted that other materials can be used as substitutes for HEMT structure 59. For example, other Group III–V compounds such as GaAs can be used as support layer 60. AlGaAs can be used for donor and spacer layers 66 and 64, and GaAs can be used for channel and cap layers 62 and 81. First and second implant barriers 78 and 79 are disposed underneath gate contact 72 shown in FIG. 4A, or under T-gate 80 shown in FIG. 4B. Quantum well 74 is defined by implant barriers 78 and 79. Implant barriers 78 and 79 are fabricated prior to the processing step of depositing gate contact 72 or T-gate 80 onto the surface of Schottky layer 68. In this embodiment, a positively charged Gallium (Ga+) ion beam with 50 KeV beam energy is directed and scanned in the surface of semiconductor substrate 59 with a beam size of approximately 8 nanometers in diameter. The dosage used for the FIB can be set at a value within the range of $1\times10^{13}/cm^2$ to $1\times10^{14}/cm^2$.

FIG. 4C shows the top plan view of structure 58 of FIG. 4A. Implant barriers 78 and 79 are disposed perpendicular to the direction of electron flow 82 during the state of resonance and when an electric field is applied across the implant barriers 78 and 79. Electrons need to tunnel through implant barriers 78 and 79 from source 71 to drain 75 under the applied electric field during resonance.

Reference is now directed back to FIG. 4A for the explanation of the operation of HEMT structure 58. As with any conventional MESFET, charge carriers travel from source 71 to drain 75 via a channel under gate contact 72. Instead of travelling directly underneath gate contact 72, electrons travels in channel layer 62. Layers 66, 64 and 62 are selectively doped such that the bandgaps in the respective layers are arranged in decreasing order. Being lattice-matched and in direct physical contact, the Fermi level is uniform throughout these layers. As a result, conduction band levels are also arranged in decreasing order from layers 66, 64 and 62, respectively. Electrons have a tendency to travel in a medium with the lowest energy state. Consequently, electrons travel in channel layer 62 having the lowest conduction band energy in the form of a very thin charged layer, called Two Dimensional Electron Gas (2DEG), and is signified by reference numeral 76 in FIGS. 4A and 4B. The placement of a doped layer adjacent to an undoped layer as shown in donor layer 66 and channel layer 62 is called modulated doping. The process of modulated doping is a unique technique to introduce a 2DEG layer in a HEMT. Electrons traveling in a doped layer encounter more charge scatterings by the doped ions. They can travel relatively less impeded in an undoped layer. As a consequence, electrons experience a higher mobility in 2DEG layer 76 which resides in the undoped channel layer 62. It is for the aforementioned reasons that a HEMT can operate faster than a conventional MESFET.

The use of a HEMT as a resonant tunneling transistor further improves the operational speed as a switching device. As with the embodiment shown in FIGS. 4A–4C, first and second implant barriers 78 and 79 isolate quantum well 74. Due to the close proximity of first and second barriers 78 and 79. The energy sub-bands are distinctly separated. Under an applied voltage potential across drain 75 and source 71, with drain 75 being more positive than source 71, when the Fermi level of source 71 coincides with the energy of one of the sub-bands, electrons tunnel through first implant barrier 78 into quantum well 74, and tunnel out of quantum well 74 through second implant barrier 79 into drain 75. It will be noted that the electrons are substantially confined within 2DEG layer 76 as shown in FIGS. 4A and 4B. Gate 73 needs only to be varied a small fraction of a Volt for structure 58 to function as a switching device. Since no wide voltage swing at gate 73 is involved, structure 58 may be used as a high-frequency switching device.

In order to reduce the parasitic capacitance of HEMT 58 for further speed improvement, the gate length can be reduced. The result is that gate contact 72 would become a narrow and thin strip of conductor with a small cross-sectional area and thus high resistance. High gate resistance degrades the performance of HEMT 58. In an attempt to alleviate this drawback, a goblet-shaped gate contact called a T-gate identified by reference numeral 80 as shown in FIG. 4B is incorporated in structure 58.

T-gate contact 80 is deposited on the top surface of Schottky layer 68 through recess 63. The formation of T-gate 80 can be found from the incorporated U.S. Pat. No. 5,155,053.

FIG. 4C shows a top elevational view of structure 58 of FIG. 4A. Attention is directed to the first and second implant barriers 78 and 79 with the elongated shape. Elongated barriers 78 and 79 are substantially perpendicular to the travelling direction of electron flows 82 during resonance of structure 58 when an electric field is applied across source 75 and drain 71.

Figure 5A:
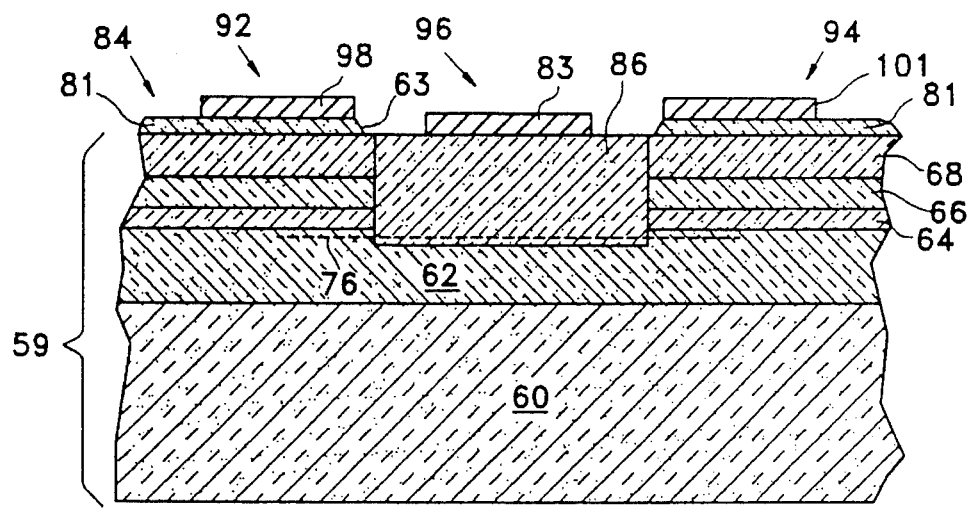
FIG. 5A is a sectional view of a third embodiment of the invention, fabricated as a one-dimensional quantum well structure.
Figure 5B:
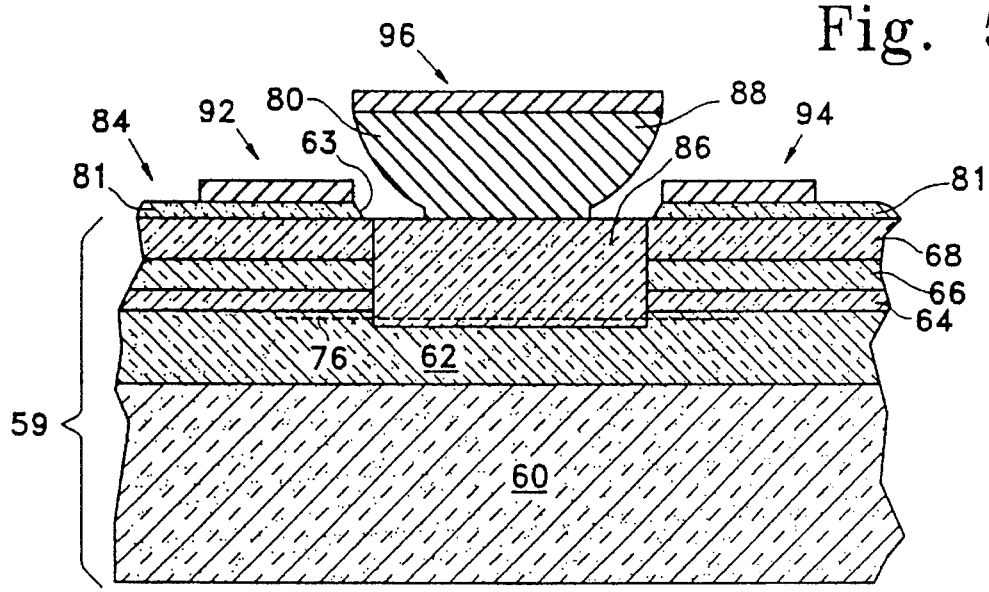
FIG. 5B is a sectional view of the quantum well structure of FIG. 5A, but with a T-gate.
Figure 5C:
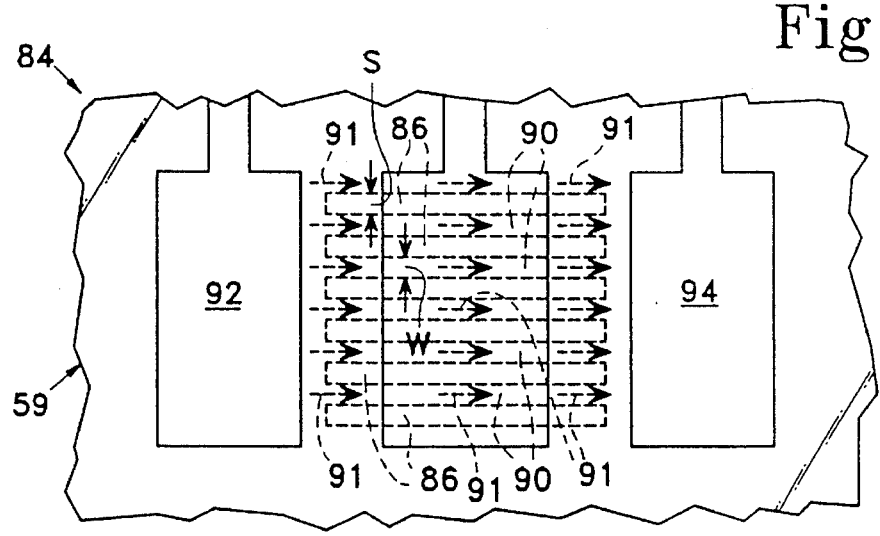
FIG. 5C is a top plan view of the quantum well structure of FIG. 5A.

FIGS. 5A–5C shows yet another embodiment of the present invention identified by reference numeral 84 fabricated as a one dimensional quantum well structure. As with the previous embodiment, structure 84 comprises substrate 59 suitable to be built as a HEMT. Support layer 60 serves as a mechanical support for channel layer 62. On the top of channel layer 62 are disposed spacer layer 64, donor layer 66, and Schottky layer 68 respectively. There is also a cap layer 81 with a recess 63 formed atop Schottky layer 68. The functions of each of the layers are similar in nature to the previous embodiment and are not repeated in here. Source 92, gate 96 and drain 94 are arranged in a similar fashion as before. However, implant barriers 86 are elongated in shape and are substantially parallel to the traveling direction of electron flow 91 as shown in FIG. 5C. In this embodiment, the edge to edge distance between implant barriers 86 is identified by the letter W shown in FIG. 5C, and is in the order of 25 nanometers. The width of each of the implant barriers 86 is identified by the letter S and is approximately 9 nanometers. Implant barriers 86 are elongated in shape extending downwardly and reaching 2DEG layer 76. Implant barriers 86 intersecting with 2DEG layer 76 form truly one dimensional quantum wells 90 and confine electron flow 91 into a one dimensional movement when passing under gate 96. The potentials of the quantum well 90 are controlled by the overlying gate 96. The imposition of vertical and lateral movement restrictions on electron flow 91 further curtail the charge scattering interferences and the electron-hole recombination. In essence, the motion of an electron inside one dimensional quantum well 90 is ballistic, instead of random scattering. Within quantum wells 90, during its journey as a conduction electron, the electron may encounter a backward repulsion from other electrons in the conduction band, or a recombination with holes in the valance band. Basically, for a conduction electron to pass through quantum well 90, it is somewhat of a hit or miss process. However, with a short channel length, the probability of electron completing the conduction journey is improved and current density is in turn maximized. In this embodiment, implant barriers 86 are scanned in the surface of semiconductor substrate 59 in multiplicity. A higher performance quantum well structure can also be obtained with a replacement of gate contact 83 by T-gate 88 as shown in FIG. 5B. A typical dimension for the gate length of T-gate 80 in this embodiment is approximately 50 angstroms.

It should be noted in here that substrate 59 can also be a substrate of a conventional MESFET similar to substrate 37 shown in FIGS. 3A–3C.

Figure 6A:
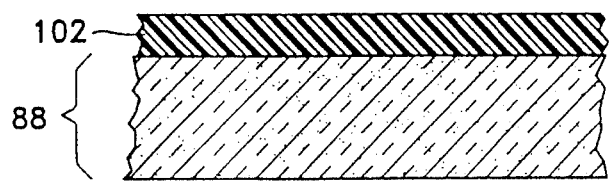
FIG. 6A–6K are sectional views of a preferred fabrication process for a resonant tunneling structure.
Figure 6B:
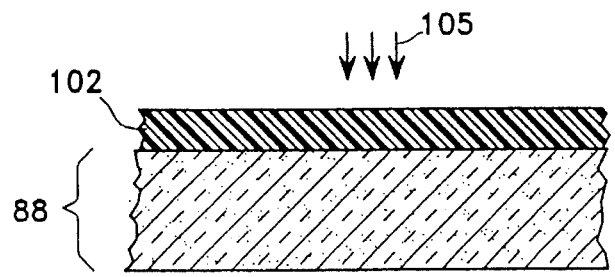
Figure 6C:
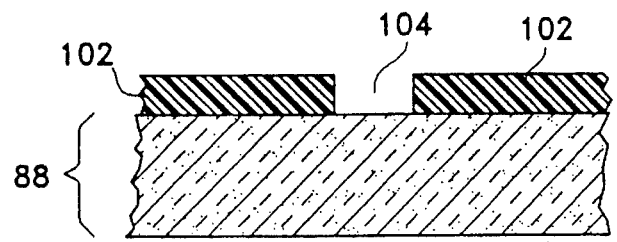
Figure 6D:
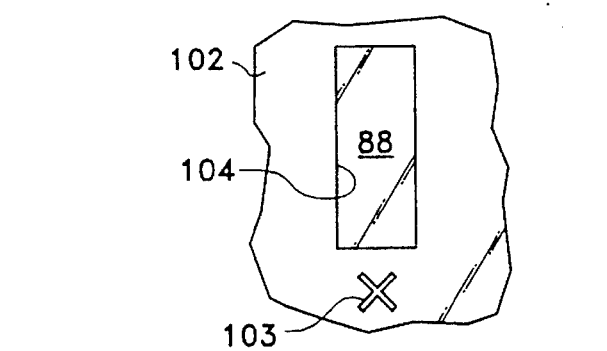

FIGS. 6A–6B show the processing steps of fabricating a resonant tunneling structure on semiconductor substrate 88. The process starts with providing semiconductor substrate 88 with resist layer 102 planarized thereon as shown in FIG. 6A. Substrate 88 can be a substrate of a conventional MESFET similar to the substrate 37 shown in FIGS. 3A to 3C. In that case, substrate 88 comprises a support layer 48 and an active layer 50 with source 53 and drain 55 implants formed by the conventional ion implantation process as shown in FIGS. 3A to 3C. Substrate 88 can also be a substrate suitable for the fabrication of a HEMT similar to substrate 59 shown in FIGS. 4A to 4C. If this is the case, substrate 88 comprises all the layers 60, 64, 66, 68 and 81 as shown in FIGS. 4A to 4C and with a recess formed in cap layer 81 via the conventional masking and etching processes. Returning to FIG. 6A, in the preferred method, the resist layer 102 is poly-methyl-methacrylate (PMMA) and is deposited on the surface of semiconductor substrate 88 to a thickness of approximately 100 nanometers. The resist layer 102 is then exposed to an electron beam 105 as shown in FIG. 6B for the purpose of forming opening 104 and alignment mark 103 as shown in FIGS. 6C and 6D. After the unwanted portions of resist layer 102 are removed, opening 104 and alignment mark 103 are available in resist layer 102. The resultant structure up to this step is shown in FIGS. 6C and 6D, in which FIG. 6D is the top plan view of FIG. 6C. Notice that resist layer 102 used in the preferred method is an electron-sensitive resist. Other resists can be used as substitutes. Examples are resists that are sensitive to the electromagnetic waves in the optical or X-ray spectrum.

Ga+ FIB 107 is then deployed to scan substrate 88 for the formation of implant barriers 106 and 108. In contrast with the prior art methods that utilize the conventional e-beam lithography and lift-off processes for the definition of field-induced quantum wells, quantum well structures fabricated by the method of the present invention yield substantial performance improvements as was previously mentioned. The implantation process is clearly shown in FIG. 6E, in which FIB 107 is directed into opening 104 in registry with alignment mark 103 shown in FIG. 6D. The equipment for generating FIB 107 is a nanoprobe having a beam diameter of less than 10 na and operated with a beam energy of approximately 50 KeV. It has been found that a relatively low voltage FIB reduces ion scatterings and atomic recoil effects to under 10 nanometers when Ga+ ions penetrate into substrate 88. In should be noted that other ions can be used for FIB instead of Gallium (Ga), examples are Beryllium (Be) or Hydrogen ($H_2$).

Figure 6E:
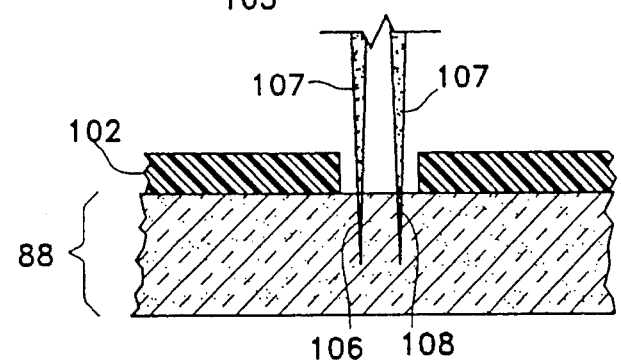
Figure 6F:
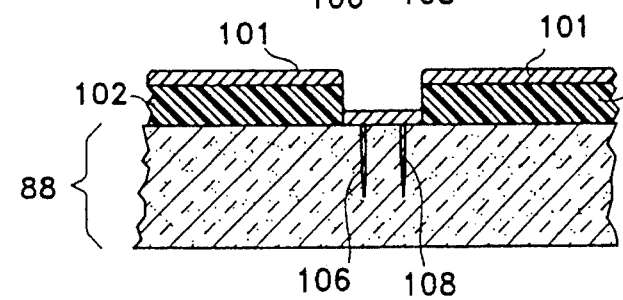
Figure 6G:
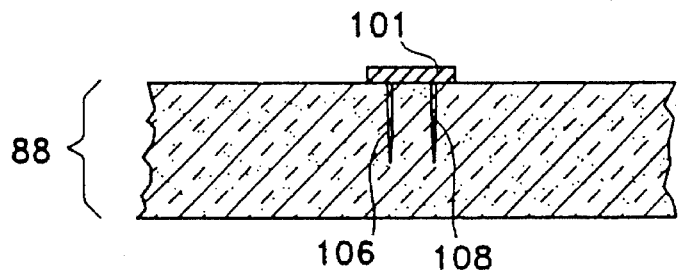

The step of metallization follows, which step is shown in FIG. 6F. Preferably, a multi-layer metal structure including layers of Titanium (Ti), Platinum (Pt), and Gold (Au), is used as conductive material 101 and is evaporated onto resist layer 102. Undesirable metal traces are removed through the lift-off process. Essentially, masking layer 102 with overlying conductive material 101 is submerged in a dissolving solvent, such as methylenechloride. The solvent only attacks resist layer 102 which is peeled off from substrate 88 and carries undesirable metal traces with it. The result of the lift-off process is shown in FIG. 6G.

An annealing process can be performed after the liftoff step. The annealing allows the damaged lattices of implant barriers 106 and 108 to be reconstructed. However, implant barriers 106 and 108 remain highly resistive as the Ga+ ions compensate the donor doped substrate 88 after the step of annealing. In the preferred method of the invention, the annealing process is conducted at an ambient temperature of 450 degrees Celsius for InP substrate. As for a GaAs substrate, the annealing temperature can be set at 700 degrees Celsius, and the annealing process is conducted within a rapid cycle of about 60 seconds.

Figure 6H:
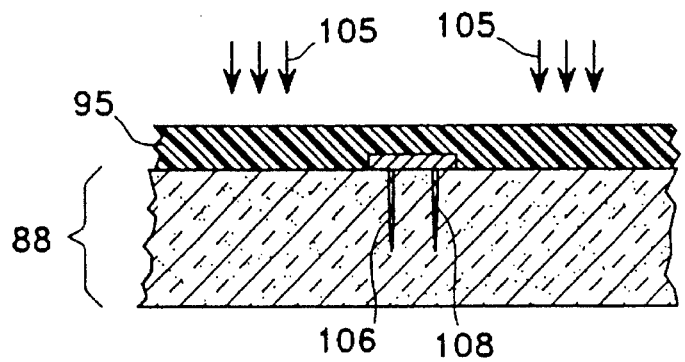
Figure 6I:
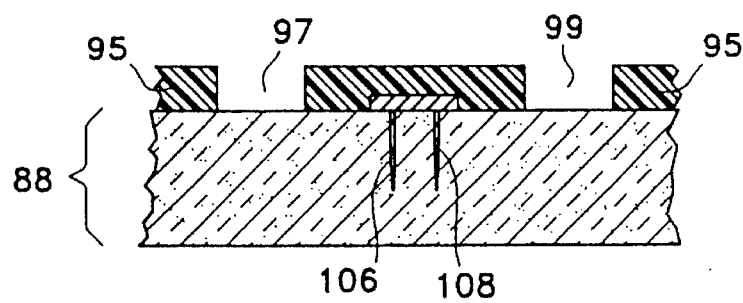
Figure 6J:
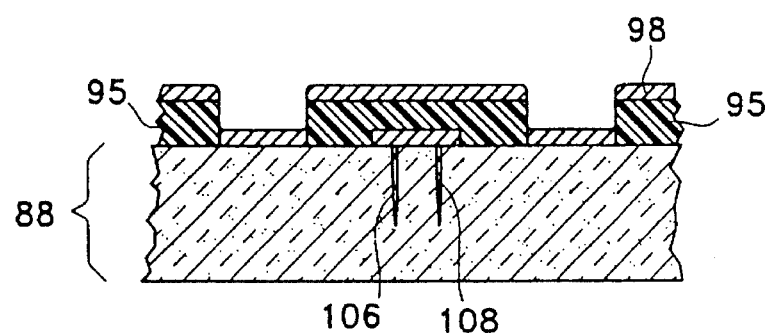
Figure 6K:
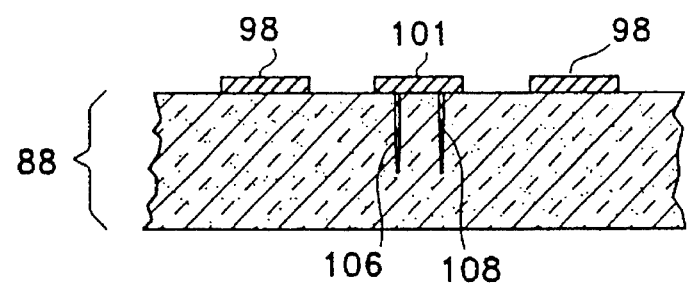

After the step of annealing, substrate 88 is again planarized with another layer of resist 95. The resist 95 is PMMA and is deposited to a thickness of approximately 100 nanometers. Electron beam 105 is again deployed to scan the second resist layer 95 for the formation of openings 97 and 99. Openings 97 and 99 will be designated as the locations for the source and the drain, respectively. The structure up to this step is shown in FIG. 6H. Unwanted resist in resist layer 95 is then removed, leaving resist layer 95 with openings 97 and 99 as shown in FIG. 6I. The step of metallization follows, resulting in the structure covered with a metal layer 98 as shown FIG. 6J. The material for metal layer 98 is preferably in the form of a multi-layer metal structure including layers of alloyed Gold (Au), Germanium (Ge) and Nickel (Ni). Another liftoff process is then performed and the resultant structure is as shown in FIG. 6K.

FIGS. 7A–7F shows another method of the invention for forming a resonant tunneling structure with a T-gate. The process starts with substrate 88 having masking layer 112 fabricated with T-gate profile 100. Again, as with the previous method, substrate 88 can be a substrate suitable for the fabrication of a MESFET or a HEMT. T-gate profile 100 can be formed in masking layer 112 via a multi-layer resist approach with decreasing levels of resist sensitivity towards the surface of semiconductor substrate 88. The method is described in P. Chao et al., "Electron Beam Fabrication of GaAs Low-Noise MESFETS Using a New Trilayer Resist Technique" *IEEE Transactions on Electron Devices*, Vol. ED-32, No. 6, Jun. 1985, pp 1042–1046. Alternatively, T-gate profile 100 can be formed in accordance with the teachings of the incorporated U.S. Pat. No. 5,155,053. Masking layer 112 with T-gate profile 100 can also include an alignment mark 103 as shown in FIG. 7B, which is a top plan view of FIG. 7A. Similar to the process described previously, implant barriers 106 and 108 are scanned in semiconductor substrate 88 via Ga+ FIB 107 in registry with the alignment mark 103. The metallization processes illustrated in FIGS. 7D–7G are also described in detail in the incorporated reference. Only a brief description is outlined herein. After the step of ion implant shown in FIG. 7C and the formation of implant barriers 106 and 108 shown in FIG. 7D, overlying metal 114 is evaporated onto the surface of resist layer 112. Metal layer 114 is preferably a multi-layer structure comprising layers of Titanium (Ti), Platinum (Pt), and Gold (Au) as shown in FIG. 7E. Resist layer 112 with overlying metal 114 is then lifted off by dissolving resist layer 112 in a solvent such as methylenechloride. The result after the lift-off process is illustrated in FIG. 7F with T-gate 116 distinctly shown adhering on the surface of semiconductor substrate 88. A conductive material 118 is then evaporated onto the surface of semiconductor substrate 88 as shown in FIG. 7G. Conductive material 118 can be a multi-layer alloy including Au, Ge and Ni. T-gate 116 serves as a self-aligned mask with source 120 and drain 122 distinguishably defined. The edge-to-edge distance between source 120 and drain 122 also defines the channel length.

It should be noted that the ion-implanting steps shown in FIGS. 6E and 7C are shown with the scanning direction being perpendicular to the direction measured from source 120 to drain 122. The perpendicular scanning of the FIB can be replaced by the parallel scanning as shown in FIGS. 8A to 8J. The processing steps of FIGS. 8A–8J are similar to the processing steps of FIGS. 6A–6F, with the exception of the ion implantation step of FIG. 8D. For the sake of clear illustration, only the ion implantation steps are elaborated.

Figure 8A:
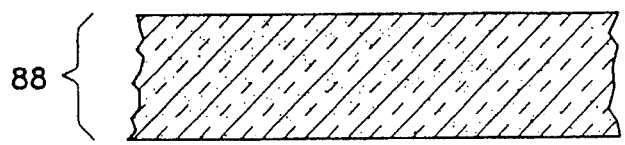
FIG. 8A–8J are sectional views of a preferred fabrication process for a one-dimensional quantum well structure.
Figure 8B:
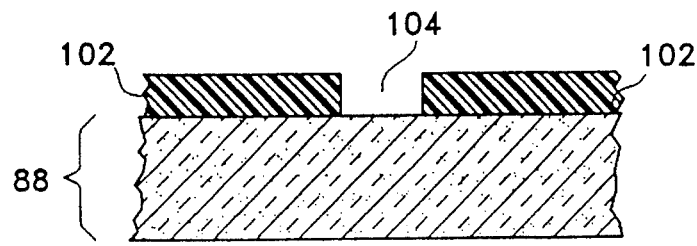
Figure 8C:
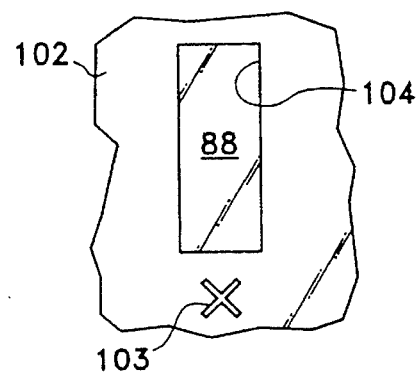
Figure 8D:
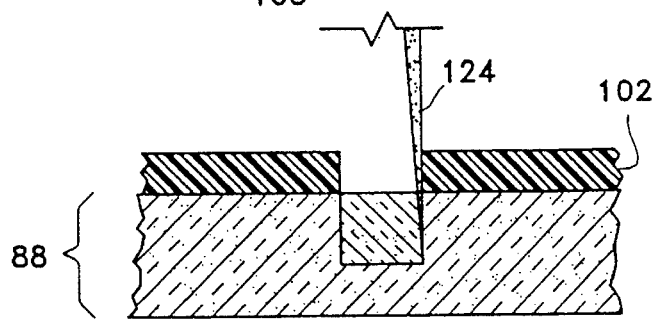
Figure 8E:
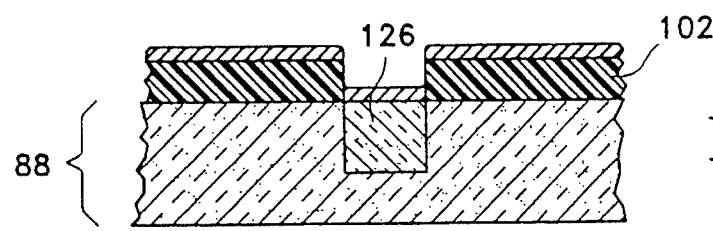
Figure 8F:
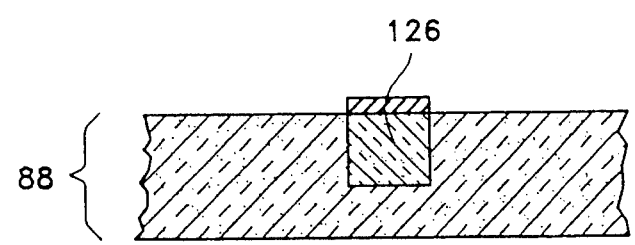
Figure 8G:
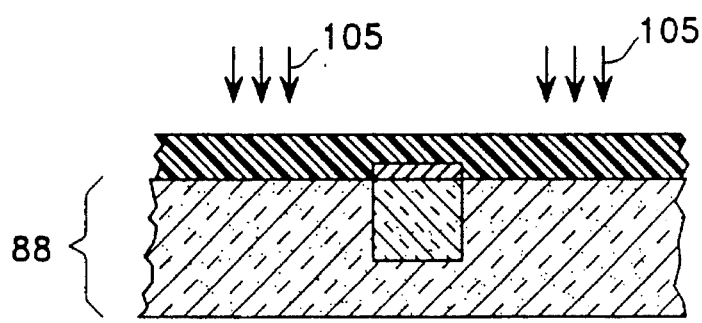
Figure 8H:
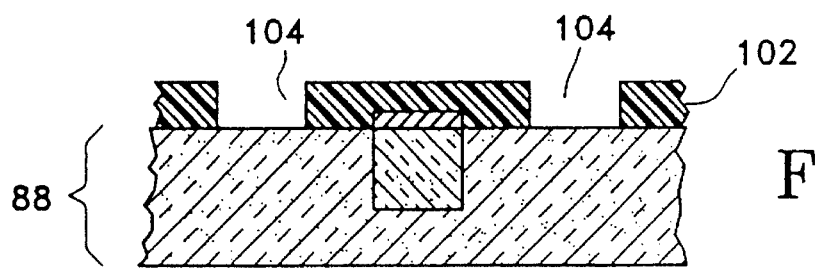
Figure 8I:
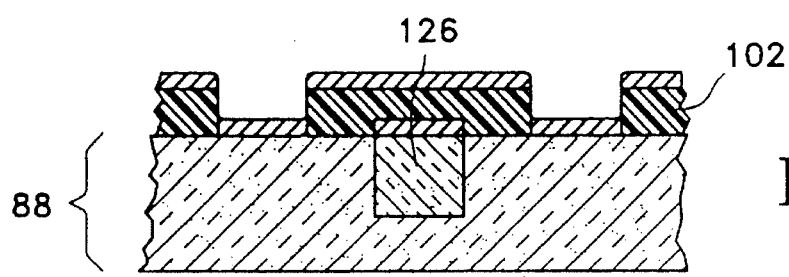
Figure 8J:
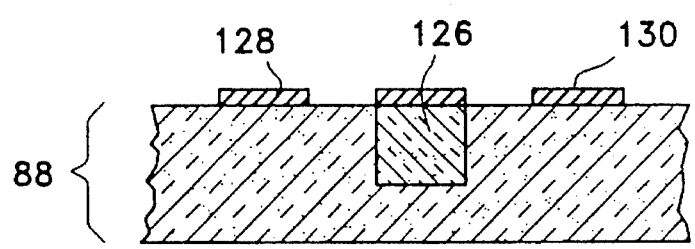
Figure 9A:
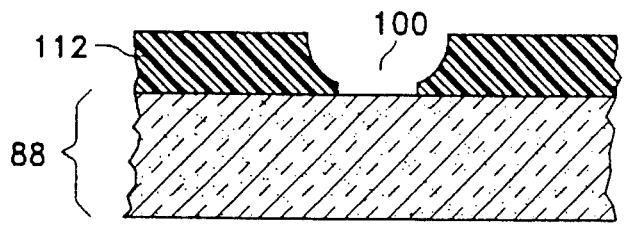
FIG. 9A–9G are sectional views of a preferred fabrication process for a one-dimensional quantum well structure with a T-gate.
Figure 9B:
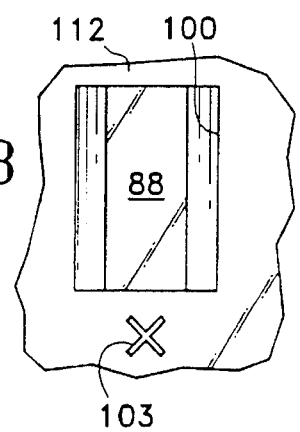
Figure 9C:
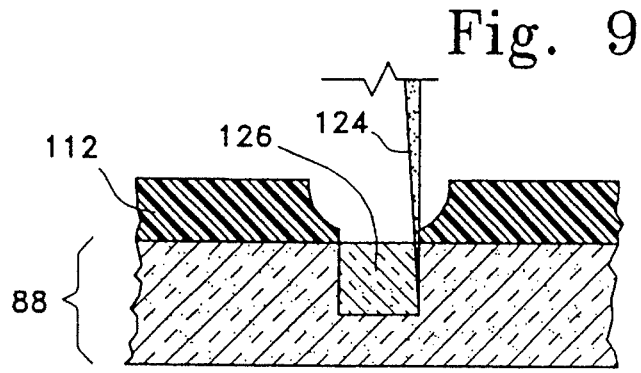
Figure 9D:
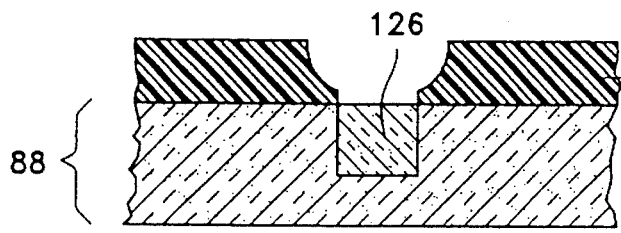
Figure 9E:
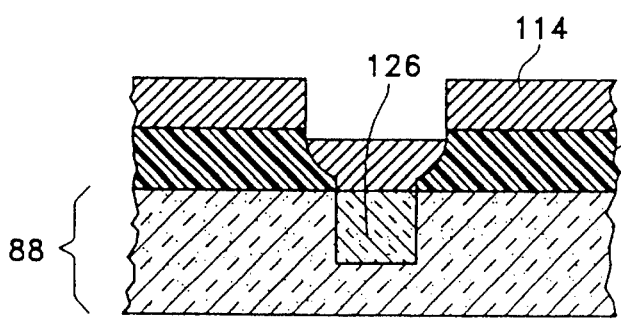
Figure 9F:
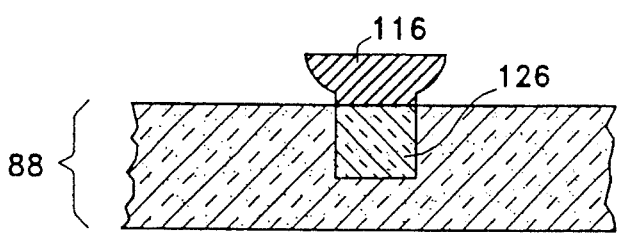
Figure 9G:
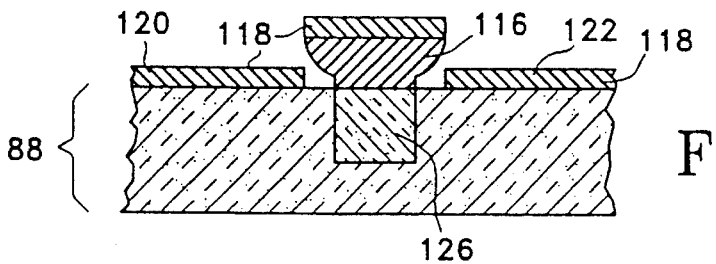

After openings 104 are formed in resist layer 102 as shown in FIGS. 8B and 8C, Ga+ FIB 124 is deployed for the implantation of implant barriers 126. The direction of scanning is substantially parallel to the direction of the flow of charged carriers, which is from source 128 to drain 130 as shown in FIG. 8J. Typically, repeated scanning steps as shown in FIG. 8D are performed for the formation of multiple implant barriers 126. The implant barriers 126 are separated from each other and maintain a predetermined spaced apart relationship. In the preferred method, the edge-to-edge distance between implant barriers is approximately 25 nanometers. Moreover, substrate 88 in the preferred method is chosen to be a substrate suitable for the fabrication of a HEMT similar to substrate 59 shown in FIGS. 5A–5C. Implant barriers 126 are formed by scanning FIB 124 such that they extend into the surface of semiconductor substrate 88 and intersect with the underlying 2DEG. The intersections of 2D election gas and the quantum wells enclosed within implant barriers 126 form substantially one dimensional quantum wells which allow electrons to travel therethrough with high mobility. After the metallization process as previously described, the finished structure is shown in FIG. 8J.

FIGS. 9A–9G illustrate the steps of forming a one-dimensional quantum well structure as shown in FIGS. 8A–8J but with T-gate 116 attached. The formation of T-gate

116 has been described in the previous steps as shown in FIGS. 7A–7G and the scanning steps for the implantation of implant barriers 126 is identical to the processing steps of FIG. 8A–8J. Again, for the sake of conciseness and clarity, the process is not repeated here.

Finally, other changes are possible within the scope of the present invention. The quantum well structures of the present invention does not restrict itself to only group III–IV semiconductor compounds. The same principles can be utilized to form quantum well structures on other materials such as Silicon (Si) or Germanium (Ge).

Furthermore, it is also apparent that the semiconductor substrate used as the basis for the fabrication of the quantum well structures can comprise an insulator with materials deposited thereon, and with active devices built on the deposited materials.

While the present invention has been shown and described with reference to preferred embodiments, it will be understood by those skilled in the art that these and other changes in form and detail may be made without departing from the scope and spirit of the invention as defined by the appended claims.

What is claimed is:

1. A quantum well structure comprising:
   a semiconductor substrate;
   a source disposed in the semiconductor substrate;
   a drain disposed in the semiconductor substrate and spaced from said source;
   a plurality of spaced elongated implant barriers disposed in the semiconductor substrate between said source and said drain, said implant barriers defining a plurality of quantum wells therebetween, each of said barriers being disposed in the semiconductor substrate substantially parallel to the direction from said source to said drain; and
   a T-gate spanning said plurality of quantum wells between said source and drain, said T-gate controllably biasing the potential of said quantum wells, whereby charge carriers travel from said source to said drain through said plurality of quantum wells when a voltage potential is applied across said source and said drain, said quantum wells being short enough to provide a substantially ballistic transport of charge carriers between said source and drain.

2. The quantum well structure as set forth in claim 1 wherein said structure comprises a high electron mobility transistor.

3. The quantum well structure as set forth in claim 1 wherein said substrate comprises group III–V compound semiconductor materials.

4. A resonant tunneling structure comprising:
   a semiconductor substrate;
   a first implant barrier disposed in the semiconductor substrate;
   a second implant barrier disposed in the semiconductor substrate and spaced from said first implant barrier, said first and second implant barriers being substantially perpendicular to the surface of the substrate;
   a source formed in said semiconductor substrate on one side of said implant barriers;
   a drain formed in said semiconductor substrate on the opposite side of said implant barriers, such that charge carriers from said source travel to said drain via said first implant barrier and said second implant barrier;
   a single quantum well disposed between said first and second implant barriers whereby when an electric field is applied across said first and said second implant barriers, charge carriers tunnel through said first implant barrier into said quantum well, and tunnel out of said quantum well through said second implant barrier when said structure is at resonance; and
   a T-gate on said substrate with a lower portion in contact with the substrate and spanning said first and second implant barriers, and an upper portion whose length extends beyond the lower portion in the direction of both said source and said drain, the length of said upper T-gate portion being substantially greater than 480 Angstroms.

5. The resonant tunneling structure as set forth in claim 4 wherein said first and second implant barriers are elongated in shape and are disposed in the semiconductor substrate substantially perpendicular to the travelling direction of the charge carriers.

6. The resonant tunneling structure as set forth in claim 4 wherein said substrate comprises:
   a support layer; and
   an active layer disposed atop said support layer, with said implant barriers, said quantum well, said source and said drain being formed in said active layer.

7. The resonant tunneling structure as set forth in claim 4 wherein said substrate comprises group III–V compound semiconductor materials.

8. The resonant tunneling structure as set forth in claim 4 wherein said structure comprises a high electron mobility transistor.

9. The resonant tunneling structure as set forth in claim 4 wherein said substrate further comprising a first layer of a first dopant concentration; and a second layer of a second dopant concentration, said first layer being disposed atop said second layer with said implant barriers extending into said second layer, such that the charge carriers from said source travel to said second layer through said first layer, tunnel through said quantum wells via said implant barriers in said second layer, and travel back from said second layer to said drain through said first layer.

10. The resonant tunneling structure as set forth in claim 9 wherein said first layer of said first dopant concentration comprises a n-typed doped material and wherein said second layer of said second dopant concentration comprises a substantially undoped material.

* * * * *